United States Patent
Vaartstra et al.

(10) Patent No.: US 7,115,166 B2
(45) Date of Patent: * Oct. 3, 2006

(54) SYSTEMS AND METHODS FOR FORMING STRONTIUM- AND/OR BARIUM-CONTAINING LAYERS

(75) Inventors: Brian A. Vaartstra, Nampa, ID (US); Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

This patent is subject to a terminal disclaimer.

(21) Appl. No.: 10/828,686

(22) Filed: Apr. 21, 2004

(65) Prior Publication Data

US 2004/0197946 A1    Oct. 7, 2004

Related U.S. Application Data

(63) Continuation of application No. 10/230,131, filed on Aug. 28, 2002, now Pat. No. 6,730,164.

(51) Int. Cl.
*C30B 25/02* (2006.01)

(52) U.S. Cl. ............... 117/86; 117/89; 117/104; 117/94; 117/95; 117/96

(58) Field of Classification Search ............... 117/86, 117/89, 104, 94, 95, 96
See application file for complete search history.

(56) References Cited

U.S. PATENT DOCUMENTS

| | | | |
|---|---|---|---|
| 5,256,244 A | 10/1993 | Ackerman | |
| 5,742,322 A | 4/1998 | Cranton et al. | |
| 5,908,947 A | 6/1999 | Vaartstra | |
| 6,143,081 A | 11/2000 | Shinriki et al. | |
| 6,203,613 B1 | 3/2001 | Gates et al. | |
| 6,271,094 B1 | 8/2001 | Boyd et al. | |
| 6,273,951 B1 * | 8/2001 | Vaartstra | 117/104 |
| 6,335,049 B1 | 1/2002 | Basceri | |
| 6,342,445 B1 | 1/2002 | Marsh | |
| 6,348,412 B1 * | 2/2002 | Vaartstra | 438/681 |
| 6,387,764 B1 | 5/2002 | Curtis et al. | |
| 6,730,164 B1 * | 5/2004 | Vaartstra et al. | 117/104 |
| 2003/0188682 A1 | 10/2003 | Tois et al. | |
| 2004/0096582 A1 | 5/2004 | Wang et al. | |

FOREIGN PATENT DOCUMENTS

EP    0 442 704 A2    12/1991

OTHER PUBLICATIONS

"Atomic Layer Deposition (ALD 2002) Conference, Aug. 19-21, 2002, at Hanyang University in Seoul, Korea," Conference Schedule [online] [retrieved Jul. 8, 2003]. Retrieved from the Internet:<URL:http://www.avs.org/conferences/ald/2002/program/aug19.html>; 3 pgs.

(Continued)

*Primary Examiner*—Robert Kunemund
(74) *Attorney, Agent, or Firm*—Mueting, Raasch and Gebhardt, P.A.

(57) ABSTRACT

A method of forming (and apparatus for forming) a layer, such as a strontium titanate, barium titanate, or barium-strontium titanate layer, on a substrate by employing a vapor deposition method, particularly a multi-cycle atomic layer deposition process.

54 Claims, 2 Drawing Sheets

OTHER PUBLICATIONS

"Atomic Layer Deposition (ALD 2002) Conference, Aug. 19-21, 2002, at Hanyang University in Seoul, Korea," Oral and slide Presentations [CD-ROM]. Available online from the Internet:<URL:https://www.avs.org/conferences/ald/2002/cd_form.html: 2 CDs.

Gordon et al., "Vapor deposition of metal oxides and silicates: possible gate insulators for future microelectronics," *Chem. Mater.*, 2001, 13(8):2463-4.

Hawley, *The Condensed Chemical Dictionary*, 10$^{th}$ Edition, Van Nostrand Reinhold Co., New York, 1981; 225-226.

Hendrix et al., "Composition control of $Jf_{1-x}Si_xO_2$ films deposited on Si by chemical-vapor deposition using amide precursors," *Appl. Phys. Lett.*, Apr. 1, 2002; 80(13):2362-4.

Lee et al., "High-k gate dielectric applications using ALD Hf-based oxides," *Solid State Technology*, Jan. 2003; 46(1): 45-6, 56.

Liu et al., "Atomic Layer Deposition of Hafnium Oxide Thin Films from Tetrakis(dimethylamino)Hafnium (TDMAH) and Ozone," *Mat Res Soc Symp Proc*, 2003;765:97-102.

Maruyama et al., "Silicon dioxide thin films prepared by chemical vapor deposition from tetrakis (dimethylamino) silane and ozone," *Appl. Phys. Lett.*, Aug. 2, 1993; 63(5):611-13.

Ohshita et al., "Hfo$_2$ growth by low-pressure chemical vapor deposition using the Hf(N(C$_2$H$_5$)$_2$)$_4$/O$_2$ gas system," *Journal of Crystal Growth*, 2001; 233:292-7.

Ohshita et al., "Using tetrakis-diethylamido-hafnium for HfO$_2$ thin-film growth in low-pressure chemical vapor deposition," *Thin Solid Films*, 2002; 406:215-18.

Ritala et al., "Atomic layer deposition of oxide thin films with metal alkoxides as oxygen sources," *Science*, Apr. 14, 2000; 288:319-21.

Suzuki et al., "Atomic Layer Deposition of HfO$_2$ using Hf(N(C$_2$H$_5$)$_2$)$_4$ and O$_3$," Poster Presentation, *ALD 2002 Conference*, Hanyang University, Seoul, Aug. 19, 2002; 14 pages.

Vaartstra et al., Syntheses and Structures of a Series of Very Low Coordinate Barium Compounds: Ba[N(SiMe$_3$)$_2$]$_2$(THF)$_2$, {Ba[N(SiMe$_3$)$_2$]$_2$(THF)}$_2$, and {Ba[N(SiMe$_3$)$_2$]$_2$}$_2$, *Inorg. Chem.*, 1991; 30:121-5.

Vehkamäki et al., "Growth of SrTiO$_3$ and BaTiO$_3$ Thin films by Atomic Layer Deposition," *Electrochemical and Solid-State Letters*, 1999; 2(10):504-6.

\* cited by examiner

SYSTEMS AND METHODS FOR FORMING STRONTIUM- AND/OR BARIUM-CONTAINING LAYERS

This is a continuation of application Ser. No. 10/230,131, filed Aug. 28, 2002, now U.S. Pat. No. 6,730,164, which is incorporated herein by reference.

FIELD OF THE INVENTION

This invention relates to methods of forming a layer on a substrate using a vapor deposition process, particularly a multi-cycle atomic layer deposition (ALD) process, using one or more Group IIA metal precursor compounds and optionally other metal (e.g., titanium) precursor compounds, typically in the presence of one or more reaction gases. The precursor compounds and methods are particularly suitable for the formation of strontium and/or barium titanate dielectric layers on semiconductor substrates or substrate assemblies.

BACKGROUND OF THE INVENTION

Capacitors are the basic energy storage devices in random access memory devices, such as dynamic random access memory (DRAM) devices and ferroelectric memory (FE-RAM) devices. They consist of two conductors, such as parallel metal or polysilicon plates, which act as the electrodes (i.e., the storage node electrode and the cell plate capacitor electrode), insulated from each other by a dielectric material.

The continuous shrinkage of microelectronic devices such as capacitors over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material to construct microelectronic devices. However, when the $SiO_2$ layer is thinned to 1 nm (i.e., a thickness of only 4 or 5 molecules), as is desired in the newest microelectronic devices, the layer no longer effectively performs as an insulator due to the tunneling current running through it. This $SiO_2$ thin layer deficiency has lead to the search for improved dielectric materials.

High quality dielectric layers containing Group IIA metal titanates such as $SrTiO_3$, $BaTiO_3$, and $(Ba_{1-x}Sr_x)TiO_3$ are of interest to the semiconductor industry as they exhibit higher permitivities than do dielectric layers containing $SiO_2$. Consequently, the semiconductor industry has been extensively evaluating strontium, barium, and titanium precursor compounds that can be used in vapor deposition processes.

Chemical vapor deposition (CVD) is a continuous, single step vapor deposition process that can be used to deposit dielectric films (i.e., layers) having excellent conformality and is therefore of significant interest in making strontium and barium titanate thin films. In CVD, excellent conformality is achieved when the process is carried out at a temperature low enough that the surface reactions are the rate-limiting step in the film growth. At higher temperatures the precursor compound transformation becomes the limiting factor, causing a degradation of the conformality.

Atomic layer deposition (ALD) is a more sophisticated vapor deposition process capable of forming even higher quality dielectric layers due to the self-limiting film growth and the optimum control of atomic-level thickness and film uniformity. Using the ALD process, several sequential process cycles are employed to deposit the layer on the substrate one monolayer at a time per cycle until the desired layer thickness is achieved. For each cycle of the ALD process, vapors of one or more precursor compounds are pulsed into the deposition chamber and are chemisorbed onto the substrate. Typically, one or more vaporized reaction gases (e.g., water vapor) are pulsed into the deposition chamber to react with the chemisorbed precursor compound(s) and cause the deposition of the desired layer onto the substrate. With the ALD process, more reactive precursors can be used, without the problem of gas-phase reactions, resulting in lower temperature requirements at the substrate.

Vehkamäki et al., "Growth of $SrTiO_3$ and $BaTiO_3$ Thin Films by Atomic Layer Deposition," Electrochemical and Solid-State Letters, 2(10):504–506 (1999) describe thin films of $SrTiO_3$ and $BaTiO_3$ deposited by ALD processes making use of a novel class of strontium and barium precursors, i.e., their cyclopentadienyl compounds, together with titanium tetraisopropoxide and water. Prior to their discovery, Vehkamäki et al. state that the selection of strontium and barium precursor compounds has been limited to their β-diketonate compounds that do not react with water or oxygen at temperatures low enough for the self-limiting growth mechanism of ALD processes.

The search continues for sufficiently volatile Group IIA metal precursor compounds, especially strontium and/or barium precursor compounds, to employ successfully in vapor deposition processes, particularly ALD processes, to form, for example, strontium titanate, barium titanate, and barium-strontium titanate dielectric layers.

SUMMARY OF THE INVENTION

This invention provides vapor deposition processes, and particularly a multi-cycle atomic layer deposition (ALD) processes, for forming a metal-containing layer on a substrate using one or more Group IIA metal diorganoamide precursor compounds, and optionally one or more other metal-containing precursor compounds (e.g., titanium precursor compounds) and/or one or more reaction gases, such as water vapor. Preferably, the formed layer is an oxide layer, which can be used as a dielectric layer. Examples of such layers are primarily composed of a Group IIA metal titanate, such as strontium titanate, barium titanate, or barium-strontium titanate.

In one embodiment, the present invention provides a method of forming a layer on a substrate, such as is used in the manufacturing of a semiconductor structure. The method includes: providing a substrate (preferably a semiconductor substrate or substrate assembly such as a silicon wafer); providing a vapor including one or more Group IIA metal precursor compounds of the formula $M(NRR')_2$, wherein R and R' are each independently an organic group (preferably having 1 to 10 carbon atoms, which are optionally replaced by or substituted with silicon, oxygen, and/or nitrogen atoms and/or groups containing such atoms), and M is selected from the group consisting of barium, strontium, calcium, and magnesium (preferably, strontium and barium); and directing the vapor to the substrate to form a metal-containing layer (preferably, a metal oxide layer, which is useful as a dielectric layer) on a surface of the substrate using an atomic layer deposition process that includes a plurality of deposition cycles.

In another embodiment, the present invention provides a method of forming a layer on a substrate. The method includes: providing a substrate (preferably a semiconductor substrate or substrate assembly such as a silicon wafer); providing a vapor including one or more Group IIA metal precursor compounds of the formula M(NRR')$_2$ (Formula I), wherein R and R' are each independently an organic group (preferably having 1 to 10 carbon atoms, which are optionally replaced by or substituted with silicon, oxygen, and/or nitrogen atoms and/or groups containing such atoms), and M is selected from the group consisting of barium, strontium, calcium, and magnesium (preferably, strontium and barium); providing one or more reaction gases (preferably, water vapor); and directing the vapor including the one or more Group IIA metal precursor compounds and the one or more reaction gases to the substrate to form a metal-containing layer (preferably, a metal oxide layer, which is useful as a dielectric layer) on a surface of the substrate using an atomic layer deposition process that includes a plurality of deposition cycles a plurality of deposition cycles.

In yet another embodiment, the present invention provides a method of forming a layer on a substrate. The method includes: providing a substrate (preferably a semiconductor substrate or substrate assembly such as a silicon wafer) within a deposition chamber; providing a vapor including one or more Group IIA metal precursor compounds of the formula M(NRR')$_2$ (Formula I), wherein R and R' are each independently an organic group (preferably having 1 to 10 carbon atoms, which are optionally replaced by or substituted with silicon, oxygen, and/or nitrogen atoms and/or groups containing such atoms), and M is selected from the group consisting of barium, strontium, calcium, and magnesium (preferably, strontium and barium); providing one or more reaction gases; and directing the one or more reaction gases toward the substrate with the chemisorbed species thereon to form a metal-containing layer on one or more surfaces of the substrate. Preferably, one or more inert carrier gases are introduced into the chamber after the vapor including the one or more compounds of Formula I, after the one or more reaction gases, or after both the vapor and the reaction gases.

Optionally, the methods of the present invention can also further include a step of providing a vapor including one or more metal-containing precursor compounds other than the compounds of Formula I and directing this vapor to the substrate to form a metal-containing layer. Such compounds are preferably titanium compounds, such as those of the formula Ti(AR$^1_x$)$_4$, wherein: A is O, N, C(O), or OC(O); and R$^1$ is a (C1–C10)alkyl group, wherein two of the R$^1$ alkyl groups are optionally joined together to form an alkylene group; and n=1 or 2. Using such additional precursor compounds, mixed-metal oxides can be formed such as strontium titanate, barium titanate, and barium-strontium titanate.

The precursor compounds can be directed to the substrate together (e.g., substantially simultaneously) or separately. They can be directed to the substrate in the same cycle or in separate (e.g., alternating) cycles. They can all be directed to the substrate before directing one or more reaction gases to the substrate.

In a preferred embodiment, methods of the present invention include: providing a vapor including one or more precursor compounds of Formula I and directing this vapor to the substrate and allowing the one or more compounds to chemisorb to one or more surfaces of the substrate; providing one or more reaction gases and directing the one or more reaction gases to the substrate with the chemisorbed species thereon; providing a vapor including one or more precursor compounds other than those of Formula I and directing this vapor to the substrate and allowing the one or more compounds to chemisorb to one or more surfaces of the substrate; providing one or more reaction gases and directing the one or more reaction gases to the substrate with the chemisorbed species thereon to form a metal-containing layer on one or more surfaces of the substrate. Preferably, the methods include purging excess vapor including the one or more precursor compounds from the deposition chamber after chemisorption of the compounds onto the substrate. These steps typically form a cycle that is repeated at least once, and often hundreds of times.

In another embodiment, the present invention provides a method of manufacturing a memory device structure. The method includes: providing a substrate (preferably a semiconductor substrate or substrate assembly such as a silicon wafer) having a first electrode thereon; providing one or more Group IIA metal precursor compounds of the formula M(NRR')$_2$, wherein R and R' are each independently an organic group and M is selected from the group consisting of barium, strontium, calcium, and magnesium; vaporizing the one or more precursor compounds; directing the one or more vaporized precursor compounds to the substrate to chemisorb the compounds on the first electrode of the substrate; providing one or more reaction gases; directing the one or more reaction gases to the substrate with the chemisorbed compounds thereon to form a dielectric layer on the first electrode of the substrate; and forming a second electrode on the dielectric layer.

In yet another embodiment, the present invention provides an atomic layer vapor deposition apparatus that includes: a deposition chamber having a substrate (preferably a semiconductor substrate or substrate assembly such as a silicon wafer) positioned therein; one or more vessels that include one or more Group IIA metal precursor compounds of the formula M(NRR')$_2$, wherein R and R' are each independently an organic group and M is selected from the group consisting of barium, strontium, calcium, and magnesium.

"Substrate" as used herein refers to any base material or construction upon which a metal-containing layer can be deposited. The term "substrate" is meant to include semiconductor substrates and also include non-semiconductor substrates such as films, molded articles, fibers, wires, glass, ceramics, machined metal parts, etc.

"Semiconductor substrate" or "substrate assembly" as used herein refers to a semiconductor substrate such as a metal electrode, base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein refers to any metal-containing layer that can be formed on a substrate from the precursor compounds of this invention using a vapor deposition process. The term "layer" is meant to include layers specific to the semiconductor industry, such as "barrier layer," "dielectric layer," and "conductive layer." (The term "layer" is synonymous with the term "film" frequently used in the semiconductor industry.) The term "layer" is also meant to include layers found in technology outside of semiconductor technology, such as coatings on glass.

"Dielectric layer" as used herein is a term used in the semiconductor industry that refers to an insulating layer (sometimes referred to as a "film") having a high dielectric constant that is typically positioned between two conductive electrodes to form a capacitor. For this invention, the dielectric layer contains a Group IIA metal compound where preferably the compound is a titanate, including barium titanate, strontium titanate, barium-strontium titanate, calcium titanate and magnesium titanate.

"Precursor compound" as used herein refers to a Group IIA metal compound capable of forming (typically in the presence of a reaction gas) a metal-containing layer on a substrate in a vapor deposition process. The resulting Group IIA metal-containing layers are typically oxide layers, which are useful as dielectric layers.

"Deposition process" and "vapor deposition process" as used herein refer to a process in which a metal-containing layer is formed on one or more surfaces of a substrate (e.g., a doped polysilicon wafer) from vaporized precursor compound(s). Specifically, one or more metal precursor compounds are vaporized and directed to one or more surfaces of a heated substrate (e.g., semiconductor substrate or substrate assembly) placed in a deposition chamber. These precursor compounds form (e.g., by reacting or decomposing) a non-volatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds and any reaction gases used within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below). Also, for pulsed CVD, the deposition thickness is dependent on the exposure time, as opposed to ALD, which is self-limiting (discussed in greater detail below).

"Atomic layer deposition" (ALD) as used herein refers to a vapor deposition process in which numerous consecutive deposition cycles are conducted in a deposition chamber. Typically, during each cycle the metal precursor is chemisorbed to the substrate surface; excess precursor is purged out; a subsequent precursor and/or reaction gas is introduced to react with the chemisorbed layer; and excess reaction gas (if used) and by-products are removed. As compared to the one cycle chemical vapor deposition (CVD) process, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE) (see U.S. Pat. No. 5,256,244 (Ackerman)), molecular beam epitaxy (MBE), gas source MBE, organometallic MBE, and chemical beam epitaxy when performed with alternating pulses of precursor compound(s), reaction gas and purge (i.e., inert carrier) gas.

"Chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (>30 kcal/mol), comparable in strength to ordinary chemical bonds. The chemisorbed species are limited to the formation of a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate reactive precursor compounds are alternately introduced (e.g., pulsed) into a deposition chamber and chemisorbed onto the surfaces of a substrate. Each sequential introduction of a reactive precursor compound is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood, however, that ALD can use one precursor compound and one reaction gas.

DETAILED DESCRIPTION OF PREFERRED EMBODIMENTS OF THE INVENTION

Figure 1:
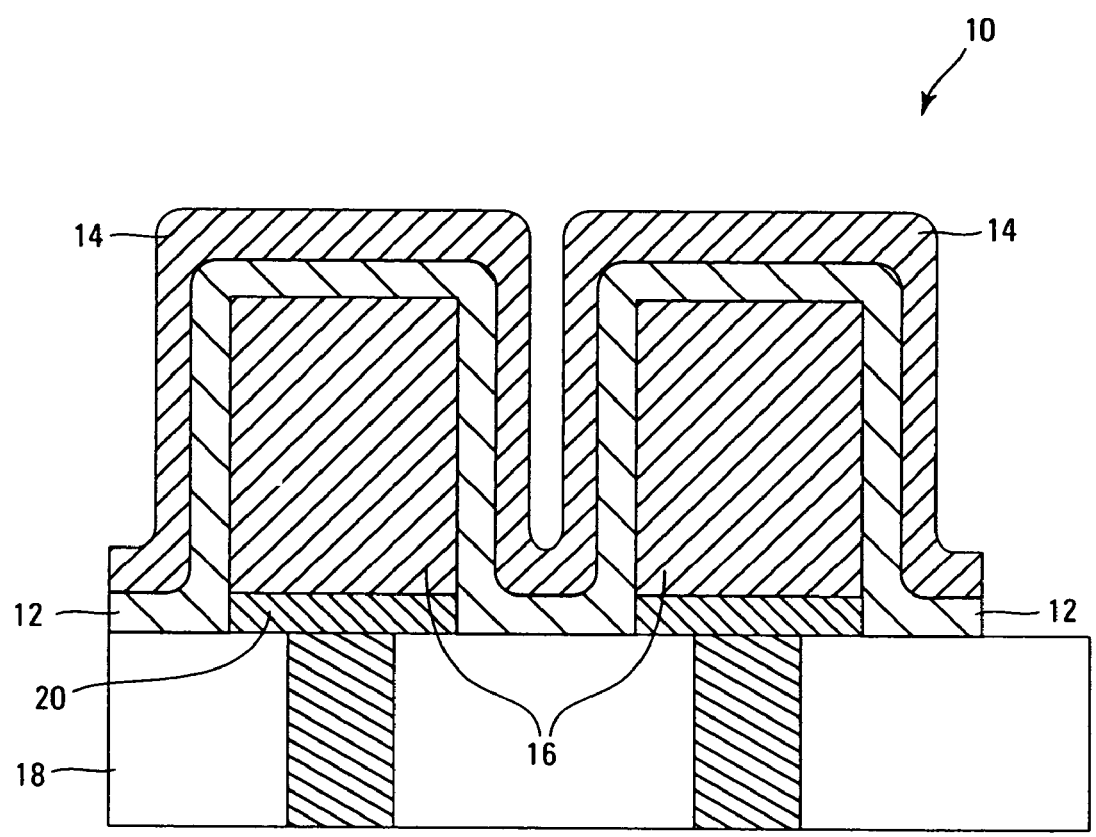
FIG. 1 is an exemplary capacitor construction.

The present invention provides methods of forming a metal-containing layer on a substrate using one or more Group IIA metal precursor compounds of the formula $M(NRR')_2$ (Formula I), wherein: R and R' are each independently an organic group; and M is selected from the group consisting of barium, strontium, calcium, and magnesium (preferably, M is Ba or Sr). Other metal-containing precursor compounds (other than those of Formula I) can also be used as can one or more reaction gases in the methods of the present invention.

The metal-containing layer formed is a Group IIA metal-containing layer, preferably a strontium- and/or barium-containing layer. The layers or films formed can be in the form of Group IIA metal oxide-containing films, for example, wherein the layers include one or more Group IIA metal oxides optionally doped with other metals. Thus, the term "Group IIA metal oxide" films or layers encompass just Group IIA metal oxide as well as doped films or layers (i.e., mixed metal oxides), such as a strontium titanate, barium titanate, or barium-strontium titanate layer.

The substrate on which the metal-containing layer is formed is preferably a semiconductor substrate or substrate assembly. Any suitable semiconductor material is contemplated, such as for example, conductively doped polysilicon (for this invention simply referred to as "silicon"). A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices and ferroelectric memory (FERAM) devices, for example.

Substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example.

The Group IIA metal precursor compounds useful in this invention are of the formula M(NRR')$_2$ (Formula I) wherein R and R' are each independently an organic group. As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal-containing layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, 2-ethylhexyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group for example, substituted with silicon atoms or donor atoms such as nonperoxidic oxygen (e.g., in the chain (i.e., ether) as well as carbonyl groups or other conventional substituents), nitrogen or sulfur. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

Preferably, the Group IIA metal precursor compounds useful in this invention are of the formula M(NRR')$_2$ wherein: R and R' are each independently an organic group, preferably having from 1 to 10 carbon atoms, which are optionally replaced by or substituted with silicon, oxygen, and/or nitrogen atoms or groups containing such atoms; and M is selected from the group consisting of strontium, barium, calcium, and magnesium (more preferably, strontium and barium). More preferably, the Group IIA metal precursor compounds are of the formula M[N(SiR"$_3$)$_2$]$_2$, wherein M is selected from the group consisting of barium and strontium, and R" is a (C1–C3)alkyl moiety.

Examples of useful such precursors compounds include Ba[N(SiMe$_3$)$_2$]$_2$ and/or Sr[NP(SiMe$_3$)$_2$]$_2$, where Me is methyl. During the use of such compounds, hexamethyl disilazane (HMDS) is the single volatile by-product during the vapor deposition process. This makes the process very compatible with conventional semiconductor fabrication processes. Such compounds are described in Vaartstra et al., Inorg. Chem., 20:121–125 (1991), for use in CVD processes; however, there was no indication that such compounds could be used in ALD processes.

Such compounds can be made using conventional techniques. For example, Ba[N(SiMe$_3$)$_2$]$_2$ can be prepared as described by Vaartstra et al. in Inorg. Chem., 20:121–125 (1991), "Synthesis and Structures of a Series of Very Low Coordinate Barium Compounds: Ba[N(SiMe$_3$)$_2$]$_2$(THF)$_2$, {Ba[N(SiMe$_3$)$_2$]$_2$(THF)$_2$}, and {Ba[N(SiMe$_3$)$_2$]$_2$}$_2$," by reacting in a drybox barium granules with HN(SiMe$_3$)$_2$ (available from Aldrich Chemical Co. Milwaukee, Wis.) in the presence of gaseous ammonia and tetrahydrofuran. Also, Sr[N(SiMe$_3$)$_2$]$_2$ can be prepared using essentially the same synthetic procedure but replacing the barium granules with an equimolar quantity of strontium granules. Another synthetic approach involves the reaction of a Group IIA metal halide and Li[N(SiMe$_3$)$_2$].

Other metal-containing precursor compounds can be used to make various mixed-metal complexes. For example, titanium precursor compounds suitable for use in this invention include organo-titanium compounds having the formula Ti(AR$^1_x$)$_4$, wherein: A is a difunctional (x=1) or trifunctional (x=2) polar group such as —O—, —N<, —C(O)— or —OC(O)—; and R$^1$ is a (C1–C10)alkyl group, wherein two of the R$^1$ alkyl groups are optionally joined together to form an alkylene group. Preferably, A is —O— and R$^1$ is methyl, ethyl, n-propyl, isopropyl, or butyl.

Examples of suitable titanium precursor compounds include titanium tetramethoxide, titanium tetraethoxide, titanium tetra-n-propoxide, titanium tetraisopropoxide, titanium tetra-n-butoxide, titanium tetra-t-butoxide, titanium tetra-2-ethylhexoxide, tetrakis(2-ethylhexane-1,3-diolato) titanium (i.e., octyleneglycol titanate), titanium diisopropoxide bis(acetylacetonate), titanium diisopropoxide bis(2, 2,6,6-tetramethyl-3,5-heptanedionate, titanium bis(ethyl acetacetato)diisopropoxide, bis(ethylacetoacetato) bis(alkanolato)titanium, tetrakis(dimethylamino)titanium, tetrakis (diethylamino)titanium, tetrakis(ethylmethylamino)titanium, titanium (triethanolaminato)isopropoxide, all available from Sigma-Aldrich Chemical Co., Milwaukee, Wis. or as TYZOR organic titanates from E. I. du Pont de Nemours & Co., Wilmington, Del. Preferably, the titanium precursor compound is a tetralkylorthotitanate of the formula Ti(OR$^2$)$_4$, wherein all of the R$^2$ groups are the same and are (C1–C10)alkyl moieties, preferably (C1–C4)alkyl moieties, e.g., methyl, ethyl, isopropyl and t-butyl.

The titanium precursor compounds can also be prepared by reacting one mole of titanium tetrachloride with four moles of the organic compound (e-g., an alcohol) needed to provide the desired R$^2$ groups. For example, titanium tetraisopropoxide (i.e., tetraisopropylorthotitanate) can be prepared by reacting titanium tetrachloride with isopropyl alcohol followed by distillation of the crude reaction product.

The precursor compounds may be liquids or solids at room temperature (preferably, they are liquids at the vaporization temperature) Typically, they are liquids sufficiently volatile to be employed using known vapor deposition techniques. However, as solids they may also be sufficiently volatile that they can be vaporized or sublimed from the solid state using known vapor deposition techniques.

Various combinations of reaction gases can also be used in the methods of the present invention. The reaction gas can be selected from a wide variety of gases reactive with the precursor compounds described herein, at least at a surface under the conditions of atomic layer adsorption. Examples of suitable reaction gases include oxidizing and reducing gases such as water vapor, oxygen, ozone, hydrogen peroxide, nitrous oxide, ammonia, organic amines, silanes, hydrogen, hydrogen sulfide, hydrogen selenide, hydrogen telluride, and combinations thereof. Water vapor is the preferred reaction gas for the deposition of oxides using the precursor compounds described herein.

The precursor compounds can be vaporized in the presence of an inert carrier gas if desired. Additionally, an inert carrier gas can be used in purging steps, as described below. The inert carrier gas is typically selected from the group consisting of nitrogen, helium, argon, and mixtures thereof. In the context of the present invention, an inert carrier gas is one that is generally unreactive with the complexes described herein and does not interfere with the formation of the desired metal-containing film (i.e., layer).

The deposition process for this invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal-containing (preferably dielectric) layers onto semiconductor substrates. Using either vapor deposition process, typically one or more precursor compounds are vaporized in a deposition chamber and optionally combined with one or more reaction gases to form a metal-containing layer onto a substrate. It will be readily apparent to one skilled in the art that the vapor deposition process may be enhanced by employing various related techniques such as plasma assistance, photo assistance, laser assistance, as well as other techniques.

The final layer (which is preferably a dielectric layer) formed preferably has a thickness in the range of about 10 Å to about 500 Å. More preferably, the thickness is in the range of about 50 Å to about 200 Å.

Preferably, the vapor deposition process employed in the methods of the present invention is a multi-cycle ALD process. Such a process is advantageous (particularly over a CVD process) in that it provides for optimum control of atomic-level thickness and uniformity to the deposited layer (e.g., dielectric layer) and to expose the metal precursor compounds to lower volatilization and reaction temperatures to minimize degradation. Typically, in an ALD process, each reactant is pulsed sequentially onto a suitable substrate, typically at deposition temperatures of about 25° C. to about 400° C. (preferably about 100° C. to about 300° C.), which is generally lower than presently used in CVD processes. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gases, detrimental vapor-phase reactions are inherently eliminated, in contrast to the CVD process that is carried out by continuous coreaction of the precursors and/or reaction gases. (See Vehkamäki et al, "Growth of $SrTiO_3$ and $BaTiO_3$ Thin Films by Atomic Layer Deposition," Electrochemical and Solid-State Letters, 2(10):504–506 (1999)).

A typical ALD process includes exposing an initial substrate to a first chemical species (e.g., a Group IIA metal precursor compound) to accomplish chemisorption of the species onto the substrate. Theoretically, the chemisorption forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and a second chemical species (e.g., a different compound of Formula I, a metal-containing compound of a formula other than that of Formula I, or a reaction gas) is provided to react with the first monolayer of the first species. The second species is then purged and the steps are repeated with exposure of the second species monolayer to the first species. In some cases, the two monolayers may be of the same species. As an option, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted) and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, etc. Purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) Group IIA metal precursor compound(s) and reaction compound(s) into the deposition chamber containing a semiconductor substrate, chemisorbing the precursor compound(s) as a monolayer onto the substrate surfaces, and then reacting the chemisorbed precursor compound(s) with the other co-reactive precursor compound(s). The pulse duration of precursor compound(s) and inert carrier gas(es) is sufficient to saturate the substrate surface. Typically, the pulse duration is from about 0.1 to about 5 seconds, preferably from about 0.2 to about 1 second.

In comparison to the predominantly thermally driven CVD, ALD is predominantly chemically driven. Accordingly, ALD is often conducted at much lower temperatures than CVD. During the ALD process, the substrate temperature is maintained at a temperature sufficiently low to maintain intact bonds between the chemisorbed precursor compound(s) and the underlying substrate surface and to prevent decomposition of the precursor compound(s). The temperature is also sufficiently high to avoid condensation of the precursor compounds(s). Typically the substrate temperature is kept within the range of about 25° C. to about 400° C. (preferably about 150° C. to about 300° C.), which is generally lower than presently used in CVD processes. Thus, the first species or precursor compound is chemisorbed at this temperature. Surface reaction of the second species or precursor compound can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

For a typical ALD process, the pressure inside the deposition chamber is kept at about $10^{-4}$ torr to about 1 torr, preferably about $10^{-4}$ torr to about 0.1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

As stated above, the use of the complexes and methods of forming films of the present invention are beneficial for a wide variety of thin film applications in semiconductor structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a dielectric layer is formed according to the present invention is a capacitor construction. An exemplary capacitor construction is a dynamic random access memory device, which is described with reference to FIG. 1. Referring to FIG. 1, such a memory cell 10 includes a high dielectric material 12, prepared using an ALD process to react and deposit the combination of one or more Group IIA metal precursor compounds of this invention, one or more titanium precursor compounds, and water vapor, for example, between two electrodes 14 and 16, typically made of platinum, iridium, ruthenium, ruthenium oxide, or rhodium. The bottom electrode 16 is typically in contact with a silicon-containing layer 18, such as an n-type or p-type doped silicon substrate. A conductive layer 20 is positioned between the bottom electrode 16 and the silicon-containing layer 18 to act as a barrier layer to diffusion of atoms such as silicon into the electrode and dielectric material.

Figure 2:
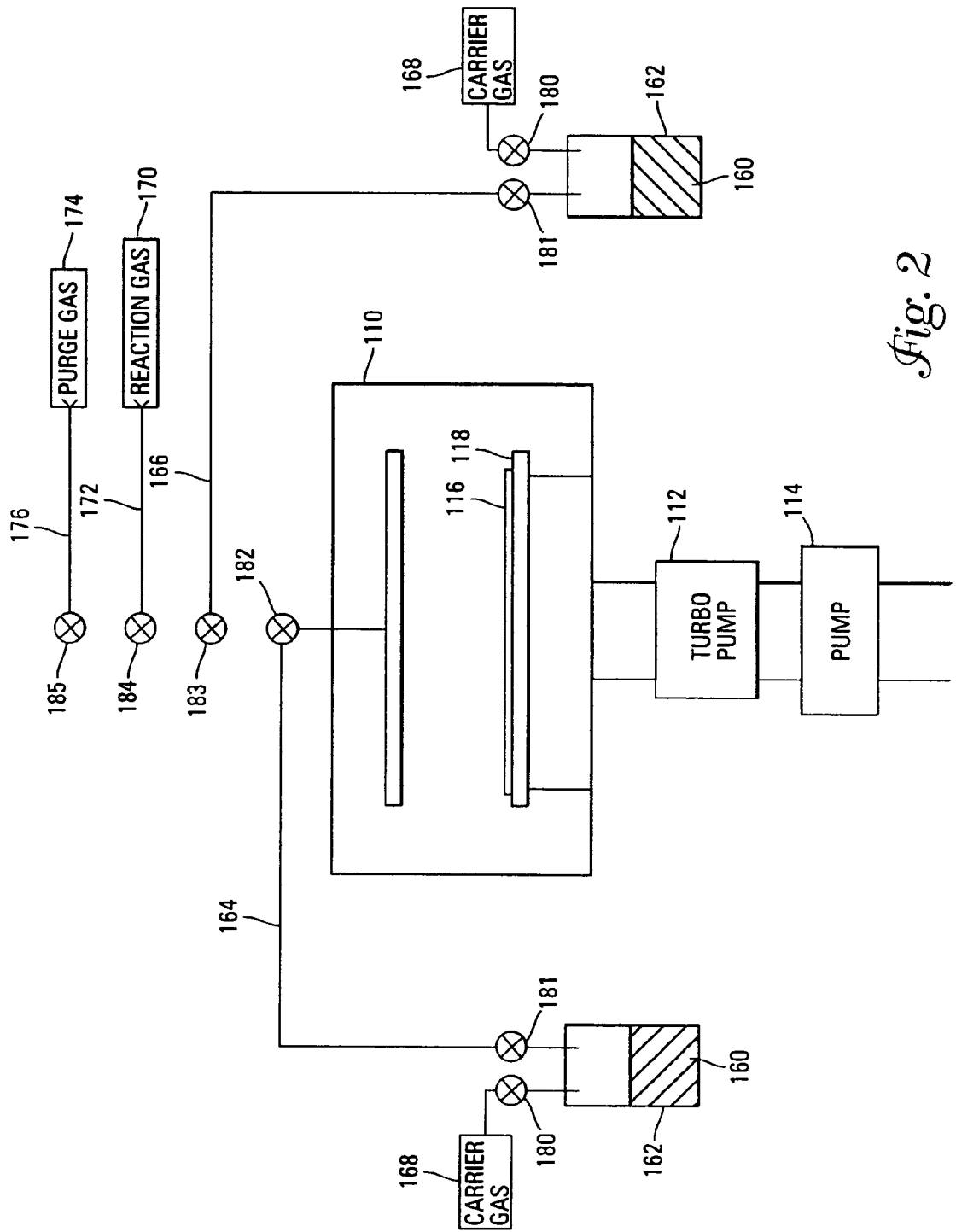
FIG. 2 is a perspective view of a vapor deposition coating system suitable for use in the method of the present invention.

A system that can be used to perform an atomic layer vapor deposition process of the present invention is shown in FIG. 2. The system includes an enclosed vapor deposition chamber 110, in which a vacuum may be created using turbo pump 112 and backing pump 114. One or more substrates 116 (e.g., semiconductor substrates or substrate assemblies) are positioned in chamber 110. A constant nominal temperature is established for substrate 116, which can vary depending on the process used. Substrate 116 may be heated, for example, by an electrical resistance heater 118 on which substrate 116 is mounted. Other known methods of heating the substrate may also be utilized.

In this process, precursor compounds 160 (e.g., a Group IIA metal precursor compound) are stored in vessels 162. The precursor compounds are vaporized and separately fed along lines 164 and 166 to the deposition chamber 110 using, for example, an inert carrier gas 168. A reaction gas 170 may be supplied along line 172 as needed. Also, a purge gas 174, which is often the same as the inert carrier gas 168, may be supplied along line 176 as needed. As shown, a series of valves 180–185 are opened and closed as required.

The following examples are offered to further illustrate the various specific and preferred embodiments and techniques. It should be understood, however, that many variations and modifications may be made while remaining within the scope of the present invention, so the scope of the invention is not intended to be limited by the examples.

EXAMPLES

Example 1

Atomic Layer Deposition of $SrTiO_3$

Separate reservoirs of the compounds $Sr[N(SiMe_3)_2]_2$ and titanium isopropoxide are attached to a vapor deposition chamber and heated to 130° C. and 45° C., respectively. Lines and valves connecting the reservoirs to the chamber are maintained 20° C. above the reservoir temperature The $Sr[N(SiMe_3)_2]_2$ remains solid; subliming into the vapor phase. The titanium source is a liquid with reasonable vapor pressure under these conditions. The substrate is a silicon wafer which has been processed up to the bottom electrode of the capacitor. The substrate is on a heated stage held at 300° C. The chamber is pumped down to a base pressure of $10^{-5}$ torr before the ALD cycles are initiated and remains under dynamic vacuum for the duration of the deposition. The precursors are pulsed into the chamber using pneumatic actuated valves under computer control. A Sr-source pulse of 1 second is followed by a 1-second purge gas pulse of argon followed by a 3-second pump-down under vacuum. A 0.5-second water vapor pulse is then introduced from a water reservoir held at ambient temperature and the vapor controlled at 25 sccm through a mass flow controller. The water pulse is followed by a 1-second argon purge (controlled at 50 sccm), and then a 3-second pump-down. A Ti-source pulse is then introduced for 1 second followed by a 1-second argon purge followed by a 3-sec pump-down. Another water vapor pulse step the same as previous ends the complete cycle. This sequence is repeated for 400 cycles, yielding a $SrTiO_3$ film of approximately 250 Angstroms thick.

Example 2

Atomic Layer Deposition of $(Ba,Sr)TiO_3$

The deposition is carried out in a fashion similar to that described in Example 1. An additional reservoir of $Ba[N(SiMe_3)_2]_2$ is connected to the chamber and heated to 160° C. The pulse sequence described above for $SrTiO_3$ is used except that every other pulse of the Sr-source is replaced by a Ba-source pulse. The film can also be made richer in either Sr or Ba by using more pulses of the desired precursor in the total number of pulses.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of manufacturing a semiconductor structure, the method comprising:
    providing a semiconductor substrate or substrate assembly;
    providing a vapor comprising one or more Group IIA metal precursor compounds of the formula $M(NRR')_2$, wherein R and R' are each independently an organic group and M is selected from the group consisting of barium, strontium, calcium, and magnesium; and
    directing the vapor comprising the one or more Group IIA metal precursor compounds to the semiconductor substrate or substrate assembly to form a metal-containing layer on a surface of the semiconductor substrate or substrate assembly using a chemical vapor deposition process.

2. The method of claim 1 wherein the semiconductor substrate or substrate assembly is a silicon wafer.

3. The method of claim 1 wherein the formed metal-containing layer has a thickness of about 10 Å to about 500 Å.

4. The method of claim 1 wherein M is strontium or barium.

5. The method of claim 1 wherein each R and R' is independently a (C1–C10)organic group.

6. The method of claim 1 wherein the metal-containing layer is a metal oxide layer.

7. The method of claim 1 wherein the metal-containing layer is a dielectric layer.

8. A method of manufacturing a semiconductor structure, the method comprising:
    providing a semiconductor substrate or substrate assembly;
    providing a vapor comprising one or more Group IIA metal precursor compounds of the formula $M(NRR')_2$ (Formula I), wherein R and R' are each independently an organic group and M is selected from the group consisting of barium, strontium, calcium, and magnesium;
    providing one or more reaction gases; and
    directing the vapor comprising the one or more Group IIA metal precursor compounds and the one or more reaction gases to the semiconductor substrate or substrate assembly to form a metal-containing layer on a surface of the semiconductor substrate or substrate assembly using a chemical vapor deposition process.

9. The method of claim 8 further comprising providing a vapor comprising one or more metal-containing precursor compounds other than the compounds of Formula I and directing this vapor to the semiconductor substrate or substrate assembly to form a metal-containing layer.

10. The method of claim 9 wherein providing a vapor comprising one or more metal-containing precursor compounds other than the compounds of Formula I comprises providing a vapor comprising $Ti(AR^1_x)_4$, wherein: A is O, N, C(O), or OC(O); and $R^1$ is a (C1–C10)alkyl group, wherein two of the $R^1$ alkyl groups are optionally joined together to form an alkylene group; and n=1 or 2.

11. The method of claim 10 wherein the formed metal-containing layer is strontium titanate, barium titanate, or barium-strontium titanate.

12. The method of claim 8 wherein M is strontium or barium.

13. The method of claim 8 wherein the metal-containing layer is a metal oxide layer.

14. The method of claim 8 wherein the metal-containing layer is a dielectric layer.

15. A method of manufacturing a semiconductor structure, wherein the method comprises:
    providing a semiconductor substrate or substrate assembly within a deposition chamber;
    providing a vapor comprising one or more Group IIA metal precursor compounds of the formula $M(NRR')_2$ (Formula I), wherein R and R' are each independently an organic group, and M is selected from the group consisting of barium, strontium, calcium, and magnesium;

directing the vapor comprising the one or more precursor compounds of Formula I to the semiconductor substrate or substrate assembly;

providing one or more reaction gases;

directing the one or more reaction gases to the semiconductor substrate or substrate assembly to form a metal-containing layer on one or more surfaces of the semiconductor substrate or substrate assembly using a chemical vapor deposition process.

16. The method of claim 15 wherein one or more inert carrier gases are introduced into the chamber with the vapor comprising the one or more compounds of Formula I, with the one or more reaction gases, or with both the vapor and the reaction gases.

17. The method of claim 15 wherein the reaction gas is selected from the group consisting of water vapor, oxygen, ozone, hydrogen peroxide, nitrous oxide, ammonia, organic amine, silane, hydrogen, hydrogen sulfide, hydrogen selenide, hydrogen telluride, and combinations thereof.

18. The method of claim 17 wherein the reaction gas is water vapor.

19. The method of claim 15 wherein the metal-containing layer is a metal oxide layer.

20. The method of claim 15 wherein the metal-containing layer is a dielectric layer.

21. The method of claim 15 further comprising providing a vapor comprising one or more metal-containing precursor compounds other than the compounds of Formula I and directing this vapor to the semiconductor substrate or substrate assembly.

22. The method of claim 21 wherein providing a vapor comprising one or more metal-containing precursor compounds other than the compounds of Formula I comprises providing a vapor comprising $Ti(AR^1{}_x)_4$, wherein: A is O, N, C(O), or OC(O); and $R^1$ is a (C1–C10)alkyl group, wherein two of the $R^1$ alkyl groups are optionally joined together to form an alkylene group; and n=1 or 2.

23. The method of claim 21 wherein the vapor comprising the one or more compounds of Formula I and the vapor comprising one or more compounds other than those of Formula I are directed to the semiconductor substrate or substrate assembly prior to directing the one or more reaction gases to the semiconductor substrate or substrate assembly.

24. The method of claim 21 wherein the vapor comprising the one or more compounds of Formula I and the vapor comprising one or more compounds other than those of Formula I are directed to the semiconductor substrate or substrate assembly substantially simultaneously.

25. The method of claim 21 comprising:

providing a vapor comprising one or more precursor compounds of Formula I and directing this vapor to the semiconductor substrate or substrate assembly;

providing one or more reaction gases and directing the one or more reaction gases to the semiconductor substrate or substrate assembly;

providing a vapor comprising one or more precursor compounds other than those of Formula I and directing this vapor to the semiconductor substrate or substrate assembly; and providing one or more reaction gases and directing the one or more reaction gases to the semiconductor substrate or substrate assembly to form a metal-containing layer on one or more surfaces of the semiconductor substrate or substrate assembly.

26. The method of claim 15 wherein providing a vapor, directing the vapor, providing one or more reaction gases, and directing the one or more reaction gases is repeated at least once.

27. The method of claim 15 wherein the Group IIA metal precursor compound is of the formula $M[N(SiR''_3)_2]_2$, wherein each R'' is independently a (C1–C3)alkyl moiety.

28. The method of claim 27 wherein the Group IIA metal precursor compound is selected from the group consisting of $Ba[N(SiMe_3)_2]_2$ and $Sr[N(SiMe_3)_2]_2$, where Me is methyl.

29. A method of forming a layer on a substrate, the method comprising:

providing a substrate;

providing a vapor comprising one or more Group IIA metal precursor compounds of the formula $M(NRR')_2$, wherein R and R' are each independently an organic group and M is selected from the group consisting of barium, strontium, calcium, and magnesium; and directing the vapor comprising the one or more Group IIA metal precursor compounds to the substrate to form a metal-containing layer on a surface of the substrate using a chemical vapor deposition process.

30. The method of claim 29 wherein M is strontium or barium.

31. The method of claim 29 wherein each R and R' is independently a (C1–C10)organic group.

32. The method of claim 29 wherein the metal-containing layer is a metal oxide layer.

33. A method of forming a layer on a substrate, the method comprising:

providing a substrate;

providing a vapor comprising one or more Group IIA metal precursor compounds of the formula $M(NRR')_2$ (Formula I), wherein R and R' are each independently an organic group and M is selected from the group consisting of barium, strontium, calcium, and magnesium;

providing one or more reaction gases; and directing the vapor comprising the one or more Group IIA metal precursor compounds and the one or more reaction gases to the substrate to form a metal-containing layer on a surface of the substrate using a chemical vapor deposition process.

34. The method of claim 33 further comprising providing a vapor comprising one or more metal-containing precursor compounds other than the compounds of Formula I and directing this vapor to the substrate to form a metal-containing layer.

35. The method of claim 34 wherein providing a vapor comprising one or more metal-containing precursor compounds other than the compounds of Formula I comprises providing a vapor comprising $Ti(AR^1{}_x)_4$, wherein: A is O, N, C(O), or OC(O); and $R^1$ is a (C1–C10)alkyl group, wherein two of the $R^1$ alkyl groups are optionally joined together to form an alkylene group; and n=1 or 2.

36. The method of claim 35 wherein the formed metal-containing layer is strontium titanate, barium titanate, or barium-strontium titanate.

37. The method of claim 33 wherein M is strontium or barium.

38. The method of claim 33 wherein the metal-containing layer is a metal oxide layer.

39. A method of forming a layer on a substrate, wherein the method comprises:

providing a substrate within a deposition chamber;
providing a vapor comprising one or more Group IIA metal precursor compounds of the formula M(NRR')$_2$ (Formula I), wherein R and R' are each independently an organic group, and M is selected from the group consisting of barium, strontium, calcium, and magnesium;
directing the vapor comprising the one or more precursor compounds of Formula I to the substrate;
providing one or more reaction gases; and
directing the one or more reaction gases to the substrate to form a metal-containing layer on one or more surfaces of the substrate using a chemical vapor deposition process.

40. The method of claim 39 wherein one or more inert carrier gases are introduced into the chamber after the vapor comprising the one or more compounds of Formula I, after the one or more reaction gases, or after both the vapor and the reaction gases.

41. The method of claim 40 wherein the reaction gas is selected from the group consisting of water vapor, oxygen, ozone, hydrogen peroxide, nitrous oxide, ammonia, organic amine, silane, hydrogen, hydrogen sulfide, hydrogen selenide, hydrogen telluride, and combinations thereof.

42. The method of claim 41 wherein the reaction gas is water vapor.

43. The method of claim 40 wherein the metal-containing layer is a metal oxide layer.

44. The method of claim 39 further comprising providing a vapor comprising one or more metal-containing precursor compounds other than the compounds of Formula I and directing this vapor to the substrate.

45. The method of claim 44 wherein providing a vapor comprising one or more metal-containing precursor compounds other than the compounds of Formula I comprises providing a vapor comprising Ti(AR$^1_x$)$_4$, wherein: A is O, N, C(O), or OC(O); and R$^1$ is a (C1–C10)alkyl group, wherein two of the R$^1$ alkyl groups are optionally joined together to form an alkylene group; and n=1 or 2.

46. The method of claim 44 wherein the vapor comprising the one or more compounds of Formula I and the vapor comprising one or more compounds other than those of Formula I are directed to the substrate prior to directing the one or more reaction gases to the substrate.

47. The method of claim 44 wherein the vapor comprising the one or more compounds of Formula I and the vapor comprising one or more compounds other than those of Formula I are directed to the substrate substantially simultaneously.

48. The method of claim 44 comprising:
providing a vapor comprising one or more precursor compounds of Formula I and directing this vapor to the substrate;
providing one or more reaction gases and directing the one or more reaction gases to the substrate;
providing a vapor comprising one or more precursor compounds other than those of Formula I and directing this vapor to the substrate; and
providing one or more reaction gases and directing the one or more reaction gases to the substrate to form a metal-containing layer on one or more surfaces of the substrate.

49. The method of claim 39 wherein the providing a vapor, directing the vapor, providing one or more reaction gases, and directing the one or more reaction gases is repeated at least once.

50. The method of claim 39 wherein the Group IIA metal precursor compound is of the formula M[N(SiR"$_3$)$_2$]$_2$, wherein each R" is independently a (C1–C3)alkyl moiety.

51. A method of manufacturing a memory device structure, the method comprising:
providing a substrate having a first electrode thereon;
providing one or more Group IIA metal precursor compounds of the formula M(NRR')$_2$, wherein R and R' are each independently an organic group and M is selected from the group consisting of barium, strontium, calcium, and magnesium;
vaporizing the one or more precursor compounds;
directing the one or more vaporized precursor compounds to the substrate;
providing one or more reaction gases;
directing the one or more reaction gases to the substrate to form a dielectric layer on the first electrode of the substrate using a chemical vapor deposition process; and
forming a second electrode on the dielectric layer.

52. The method of claim 51 wherein the Group IIA metal precursor compound is of the formula M[N(SiR"$_3$)$_2$]$_2$, wherein each R" is independently a (C1–C3)alkyl moiety.

53. An chemical vapor deposition apparatus comprising:
a deposition chamber having a substrate positioned therein; and
one or more vessels comprising one or more Group IIA metal precursor compounds of the formula M(NRR')$_2$, wherein R and R' are each independently an organic group and M is selected from the group consisting of barium, strontium, calcium, and magnesium.

54. The apparatus of claim 53 wherein the Group IIA metal precursor compound is of the formula M[N(SiR"$_3$)$_2$]$_2$ where M is strontium or barium and R" is a (C1–C3)alkyl moiety.

* * * * *

UNITED STATES PATENT AND TRADEMARK OFFICE
CERTIFICATE OF CORRECTION

PATENT NO.        : 7,115,166 B2
APPLICATION NO. : 10/828686
DATED             : October 3, 2006
INVENTOR(S)      : Vaartstra et al.

It is certified that error appears in the above-identified patent and that said Letters Patent is hereby corrected as shown below:

In column 8, line 10, delete "$Sr[NP(SiMe_3)_2]_2$" and insert --$Sr[N(SiMe_3)_2]_2$--.

Signed and Sealed this

Ninth Day of January, 2007

JON W. DUDAS
*Director of the United States Patent and Trademark Office*